(12) United States Patent
Chen et al.

(10) Patent No.: US 11,283,421 B1
(45) Date of Patent: Mar. 22, 2022

(54) SERIES NOISE ABSORPTION CIRCUIT

(71) Applicants: Inventec (Pudong) Technology Corporation, Shanghai (CN); INVENTEC CORPORATION, Taipei (TW)

(72) Inventors: Yen-Hao Chen, Taipei (TW); Ding Bing Ling, Taipei (TW); Cheng Yi Zhuang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/122,036

(22) Filed: Dec. 15, 2020

(30) Foreign Application Priority Data

Nov. 16, 2020 (CN) .......................... 202011277295.9

(51) Int. Cl.
*H03H 7/38* (2006.01)
*H03H 7/46* (2006.01)
(52) U.S. Cl.
CPC .............. *H03H 7/383* (2013.01); *H03H 7/46* (2013.01)

(58) Field of Classification Search
CPC .................................. H03H 7/383; H03H 7/46
See application file for complete search history.

(56) References Cited

U.S. PATENT DOCUMENTS 9,948,278 B2 * 4/2018 Okuda ................. H03H 9/0576

* cited by examiner

*Primary Examiner* — Stephen E. Jones
*Assistant Examiner* — Kimberly E Glenn
(74) *Attorney, Agent, or Firm* — Locke Lord LLP; Tim Tingkang Xia, Esq.

(57) ABSTRACT

A series noise absorption circuit, comprises: a differential signal transmission cable and a matching circuit. The differential signal transmission cable is electrically connected to two signal feedlines. The differential signal transmission has a first and second transmission line, the first transmission line and the second transmission line are configured to receive a differential pair of input signals from the two signal feedlines. The matching circuit is connected in series with the second transmission line. The matching circuit is configured to receive a reflective electrical signal from a noise reflection circuit, and match an input impedance corresponding the series noise absorption circuit with a common-mode impedance corresponding the two signal feedlines. A distance between the matching circuit and the noise reflection circuit is a minimal electrical length. The minimal electrical length is associated with a real part and an imaginary part of a matching impedance of the matching circuit.

8 Claims, 4 Drawing Sheets

SERIES NOISE ABSORPTION CIRCUIT

CROSS-REFERENCE TO RELATED APPLICATIONS

This non-provisional application claims priority under 35 U.S.C. § 119(a) on Patent Application No(s). 202011277295.9 filed in China on Nov. 16, 2020, the entire contents of which are hereby incorporated by reference.

BACKGROUND

1. Technical Field

This disclosure relates to a series noise absorption circuit, and particularly to a series noise absorption circuit that is able to increase the number of parameters for designing a noise absorption circuit.

2. Related Art

A differential signal is composed of two signals with the same magnitude but with opposite phases, and is widely used in high speed digital circuit. However, common mode noise is generated which interference signal transmission due to the asymmetry of the output signal of the circuit, and the asymmetrical wiring on the circuit board. Common-mode noise filter is generally used to suppress common-mode noise. The Common-mode noise filter can be categorized into reflective common-mode noise filter (R-CMF) and absorptive common-mode noise filter (A-CMF).

A-CMF usually adopts a mushroom structure, which uses three layers of circuit boards at the absorbing terminal, wherein an impedance-matching circuit is connected in parallel with the R-CMF. The impedance-matching circuit is configured to absorb the dual-band common-mode noise. The design parameters of the impedance-matching circuit can be obtained according to one parameter each of a differential signal transmission cable such as a meander line, an inductive transmission line in an absorbing common mode noise filter, and a plate capacitor to achieve impedance matching and the efficacy of absorbing the dual band common-mode noise. However, with this way of design, not only multiple layers of circuit boards are required which causes the increase of cost, but the overall size of the A-CMF is also increased.

SUMMARY

Accordingly, this disclosure provides a series noise absorption circuit.

According to one or more embodiment of the present disclosure, a series noise absorption circuit, electrically connected to two signal feed lines, the series noise absorption circuit comprising: a differential signal transmission cable, electrically connected to the two signal feed lines, the differential signal transmission cable has a first transmission line and a second transmission line, the first transmission line and the second transmission line are configured to receive a differential pair of input signals from the two signal feed lines; and an impedance matching circuit, connected in series with the second transmission line, the impedance matching circuit is configured to receive a reflected signal from a noise reflection circuit, and match an input impedance corresponding to the series noise absorption circuit and a common mode characteristic impedance corresponding to the two signal feed lines, wherein a distance between the impedance matching circuit and the noise reflection circuit is a minimum electrical length, and the minimum electrical length is associated with a real part and an imaginary part of a matching impedance of the impedance matching circuit.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
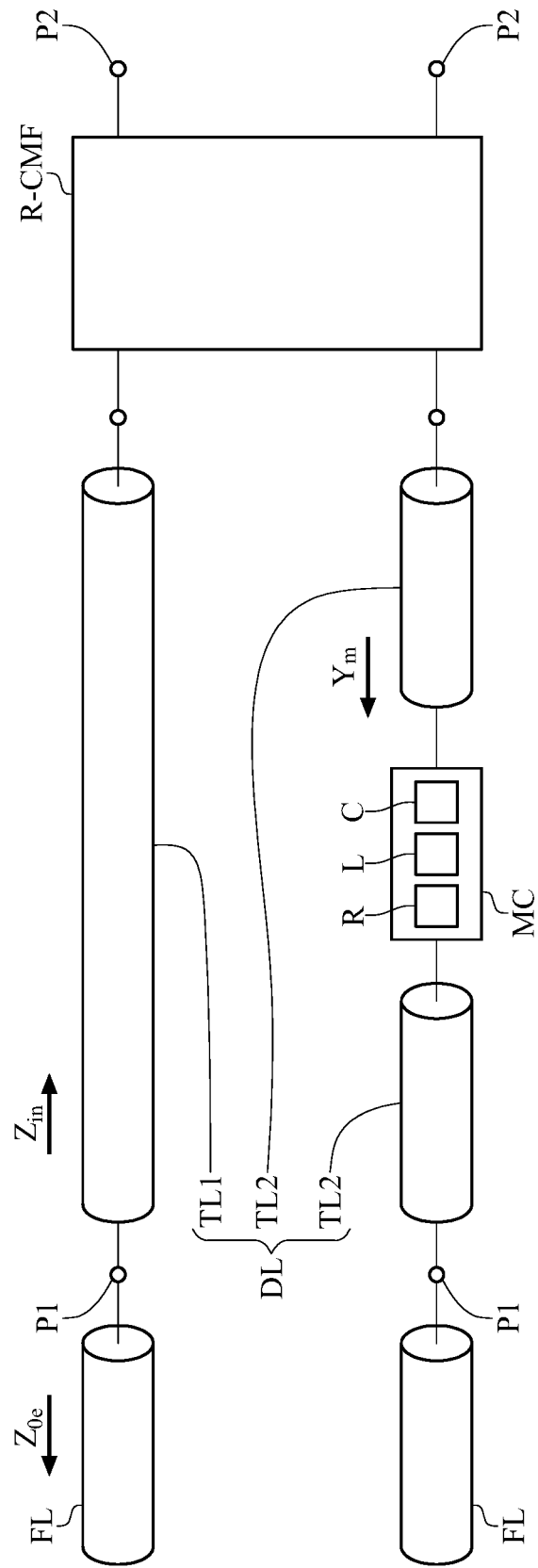
FIG. 1 is a schematic diagram illustrating an equivalent circuit of the series noise absorption circuit according to an embodiment of the present disclosure.

Please refer to FIG. 1, FIG. 1 is a schematic diagram illustrating an equivalent circuit of the series noise absorption circuit according to an embodiment of the present disclosure. The series noise absorption circuit of the present disclosure can be applied to a circuit layout of a server or a circuit layout of electronics used in vehicles, but the present disclosure is not limited thereto.

The series noise absorption circuit of the present disclosure includes two signal feed lines FL, a differential signal transmission cable DL and an impedance matching circuit MC, wherein the differential signal transmission cable DL has a first transmission line TL1 and a second transmission line TL2. The structure of the differential signal transmission cable DL and the impedance matching circuit MC shown in FIG. 1 is the absorptive common-mode filter (A-CMF).

The two signal feed lines FL are electrically connected to the first transmission line TL1 and the second transmission line TL2 of the differential signal transmission cable DL, to transmit a differential pair of input signals to the first transmission line TL1 and the second transmission line TL2. The first transmission line TL1 is electrically connected to a noise reflection circuit R-CMF to receive a reflected signal from the noise reflection circuit R-CMF.

To be more specific, the two signal feed lines FL transmit the differential pair of input signals to the first transmission line TL1 of the differential signal transmission cable DL through a first port P1, the first transmission line TL1 transmits the differential pair of input signals to the noise reflection circuit R-CMF that is electrically connected thereto. The noise reflection circuit R-CMF transmits the differential pair of input signals to a circuit that is further connected thereto through a second port P2, and receives a reflected signal corresponding to the differential pair of input signals from the circuit connected thereto through the second port P2.

The noise reflection circuit R-CMF transmits the reflected signal to the second transmission line TL2, to further transmit the reflected signal to the impedance matching circuit MC that is connected in series with the second transmission line TL2, for the impedance matching circuit MC to absorb the noise in the reflected signal with the structure of the impedance matching circuit MC connecting in series with the second transmission line TL2.

Accordingly, comparing to the mushroom structure of prior art, the series noise absorption circuit shown in the present disclosure is able to implement two-layer circuit board structure, which significantly reduces the cost and size of the noise absorption circuit.

Figure 2:
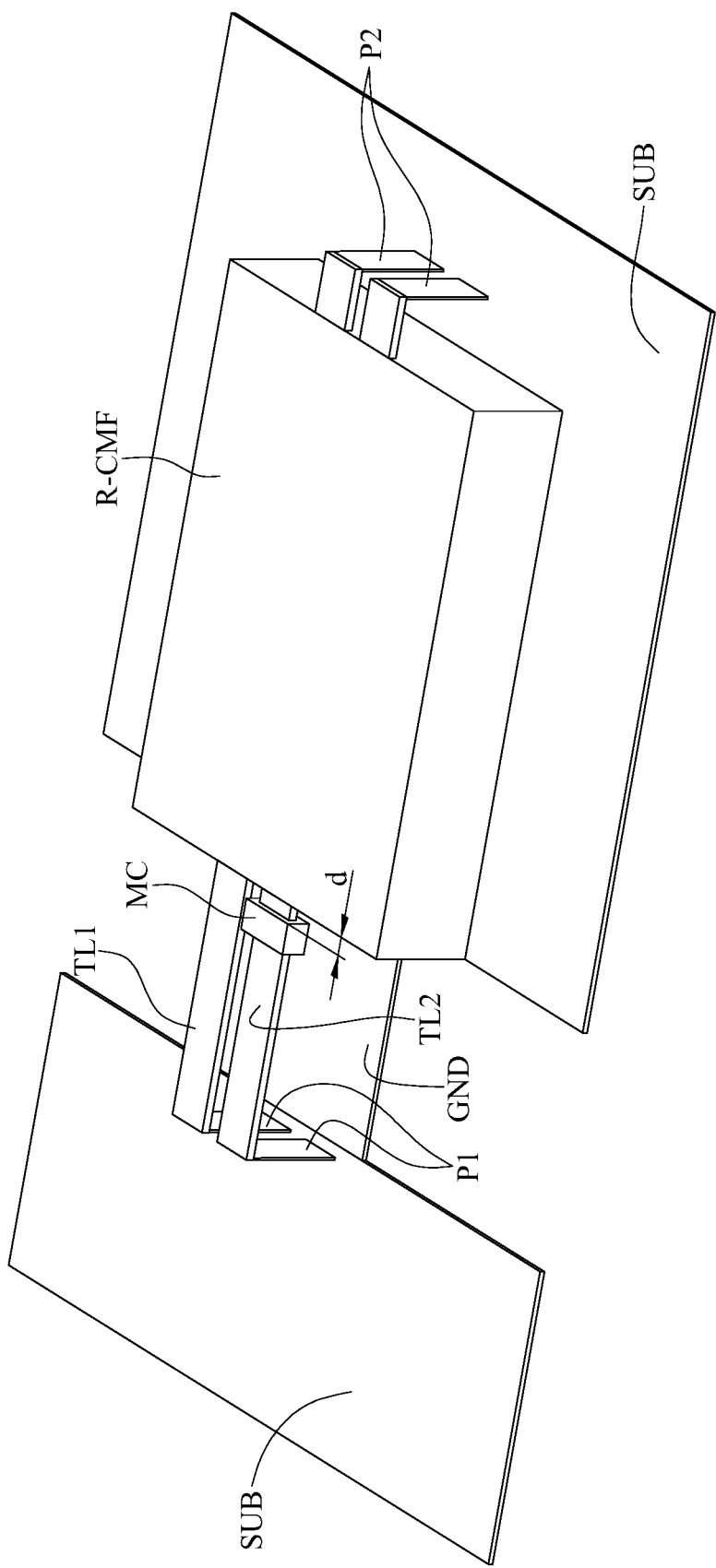
FIG. 2 is a schematic structural diagram of the series noise absorption circuit according to an embodiment of the present disclosure.

Please refer to FIG. 2, FIG. 2 is a schematic structural diagram of the series noise absorption circuit according to an embodiment of the present disclosure.

The structure of the series noise absorption circuit of the present disclosure can be as shown in FIG. 2. Specifically, the noise reflection circuit R-CMF can be disposed on a substrate SUB, the differential signal transmission cable DL is electrically connected to the noise reflection circuit R-CMF. The first port P1 of the differential signal transmission cable DL and the second port P2 of the noise reflection circuit R-CMF are connected to the substrate SUB, wherein the differential signal transmission cable DL is further spaced apart from a ground layer GND.

The impedance matching circuit MC is connected in series with the second transmission line TL2, and an electrical length between the impedance matching circuit MC and the noise reflection circuit R-CMF is a minimum electrical length d.

That is, the impedance matching circuit MC matches an input impedance corresponding to the series noise absorption circuit and a common mode characteristic impedance corresponding to the two signal feed lines FL, wherein the electrical length between the impedance matching circuit MC and the noise reflection circuit R-CMF is associated with a real part and an imaginary part of a matching impedance of the impedance matching circuit MC, so that said electrical length is a minimum electrical length d, wherein the minimum electrical length d can be obtained through an impedance matching equation, with the impedance matching equation being that the common mode characteristic impedance of the two signal feed lines FL equals to the input impedance of the series noise absorption circuit.

Figure 3:
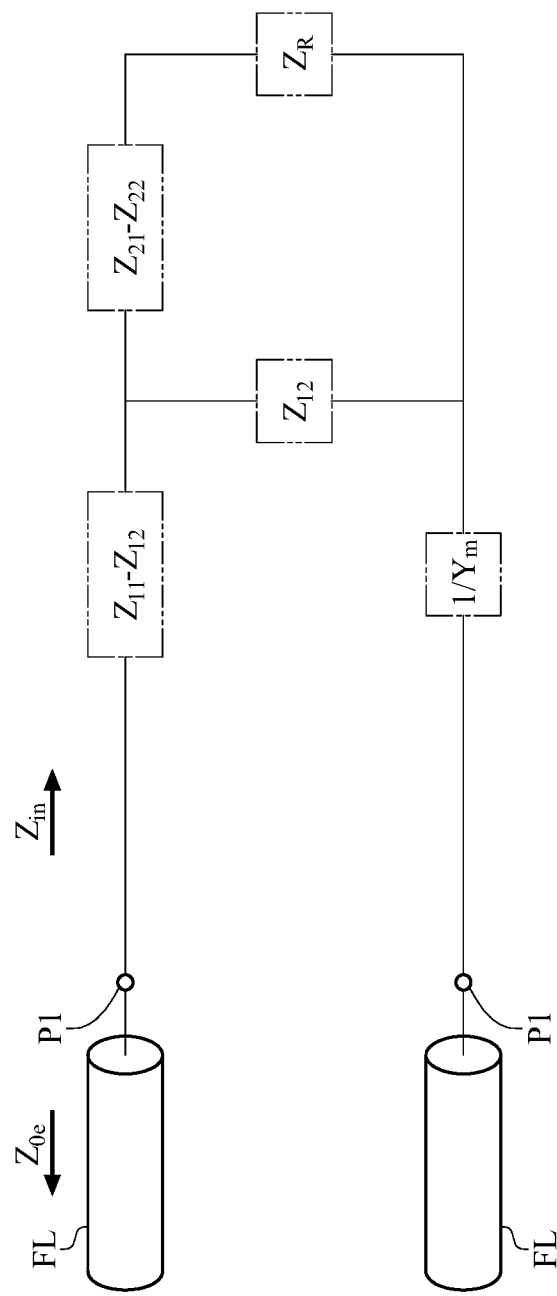
FIG. 3 is an equivalent circuit diagram of the series noise absorption circuit shown in FIG. 1.

To further explain the minimum electrical length d described above, please refer to FIG. 3, wherein FIG. 3 is an equivalent circuit diagram of the series noise absorption circuit shown in FIG. 1, that is, the differential signal transmission cable DL, the noise reflection circuit R-CMF and the impedance matching circuit MC are arranged as a T-type equivalent circuit as shown in FIG. 3.

The input impedance $Z_{in}$ of the series noise absorption circuit equals to the common mode characteristic impedance $Z_{0e}$ of the two signal feed lines FL, and the impedance value of the input impedance $Z_{in}$ is associated with the impedance value of the T-type equivalent circuit, so as to obtain the relationship between the minimum electrical length d and the impedance matching circuit MC using the impedance matching equation based on the T-type equivalent circuit.

The impedance matching equation includes equation (1) to equation (5) as shown below.

The equation of the input impedance $Z_{in}$ of the series noise absorption circuit equals to the common mode characteristic impedance $Z_{0e}$ of the two signal feed lines FL is equation (1):

$$Z_{in}=Z_{0e} \qquad (1)$$

The equation of the input impedance $Z_{in}$ being associated with the impedance value of the T-type equivalent circuit is equation (2):

$$Z_{in}=(Z_{11}-Z_{12})+[(Z_{22}-Z_{12}+Z_R)//Z_{12}]+1/Y_m \qquad (2)$$

wherein $Z_{11}$, $Z_{12}$ and $Z_{22}$ are parameters of an open-circuit impedance matrix of a two-port network; $Z_R$ is a reflection circuit impedance (common-mode input impedance) of the noise reflection circuit R-CMF; $1/Y_m$ is the reciprocal of the matching impedance of the impedance matching circuit MC, that is, the admittance of the matching impedance.

In other words, the impedance value of the input impedance $Z_{in}$ can be calculated based on the structure of the T-type equivalent circuit. Further, since $Z_{in}=Z_{0e}$ as shown in equation (1), an equation (3) can be obtained by applying equation (1) into equation (2). The equation (3) is:

$$1/Y_m=Z_{0e}-(Z_{11}-Z_{12})+[(Z_{22}-Z_{12}+Z_R)//Z_{12}] \qquad (3)$$

In addition, the parameters of the open-circuit impedance matrix $Z_{11}$, $Z_{12}$ and $Z_{22}$ can be equations (4) and (5) as shown below:

$$Z_{11}=Z_{22}=-jZ_{0e}\cot(\theta \cdot f) \qquad (4)$$

$$Z_{12}=-jZ_{0e}\csc(\theta \cdot f) \qquad (5)$$

wherein θ is the electrical length (degree) between the impedance matching circuit MC and the noise reflection circuit R-CMF, and f is a propagation constant.

The relationship of the electrical length θ, which is the distance between the impedance matching circuit MC and the noise reflection circuit R-CMF, and the matching impedance $Y_m$ of the matching circuit MC can be obtained by applying equations (4) and (5) into equation (3).

Figure 4:
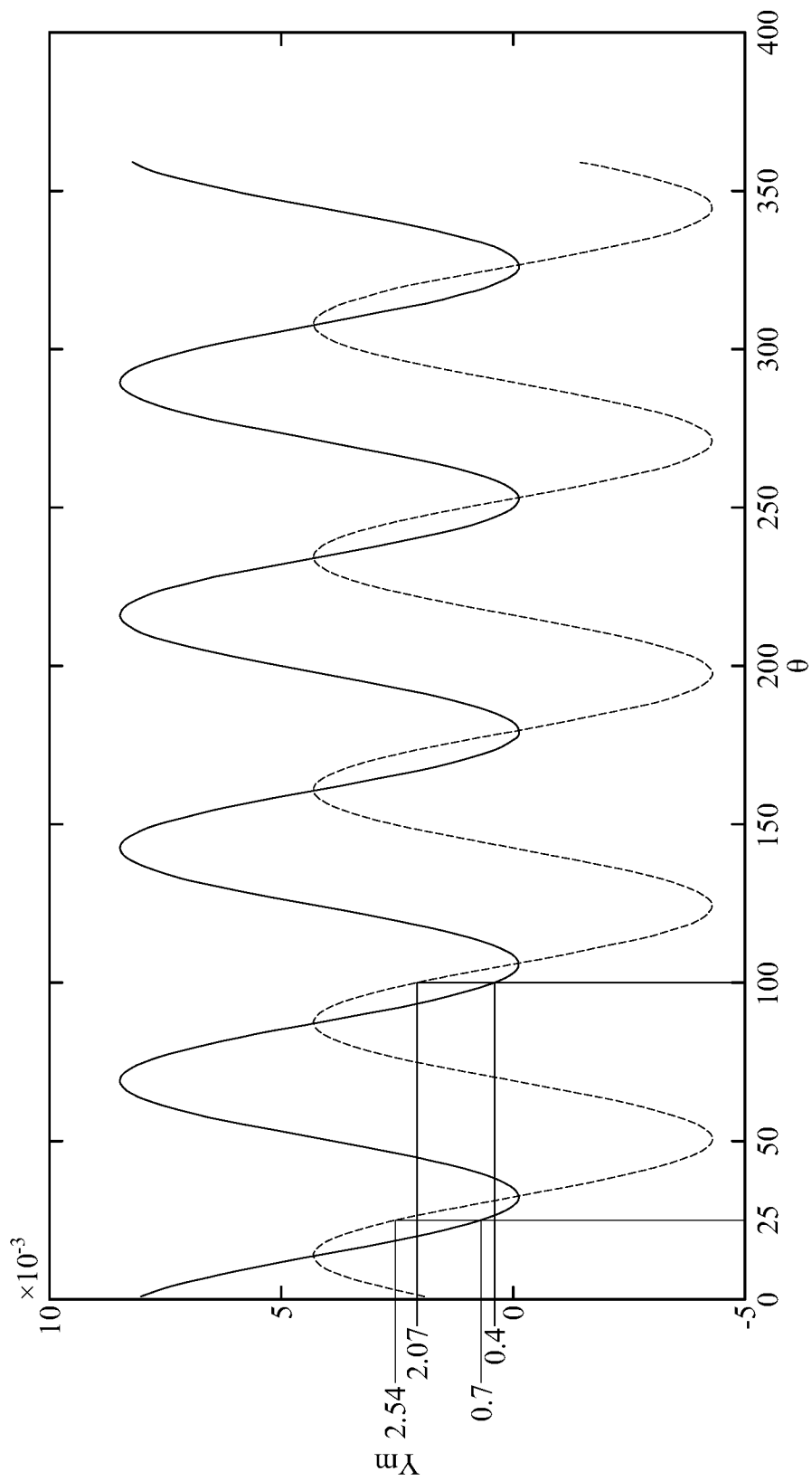
FIG. 4 is a diagram illustrating the relationship between the electrical length and matching impedance according to an embodiment of the present disclosure.

Please refer to FIG. 4, FIG. 4 is a diagram illustrating the relationship between the electrical length and matching impedance according to an embodiment of the present disclosure. That is, FIG. 4 illustrates the relationship between the electrical length θ, which is the distance between the impedance matching circuit MC and the noise reflection circuit R-CMF, and the matching impedance $Y_m$ of the matching circuit MC, wherein the solid line represents the real part of the matching impedance, and the dash line represents the imaginary part of the matching impedance.

When the matching circuit MC comprises a resistor R, a capacitor C and an inductor L as shown in FIG. 1, the resistance of the resistor R is, for example, associated with the real part (Re) of the matching impedance corresponding to the minimum electrical length d; the capacitance of the capacitor C and the inductance of the inductor L are, for example, associated with the imaginary part (Im) of the matching impedance corresponding to the minimum electrical length d. When the resistor, the capacitor C and the inductor L are a RLC circuit (the RLC circuit can be, for example, formed by connecting the resistor R in series with the LC series circuit), the electrical length between the impedance matching circuit MC and the noise reflection circuit R-CMF being associated with the real part (Re) and the imaginary part (Im) of the matching impedance of the matching circuit MC can be equations (6) and (7) as shown below:

$$r=1/(2*Re\{Y_m\}) \qquad (6)$$

$$Im\{Y_m\}=j\omega(0.5*c)+(1/j\omega 2*l) \qquad (7)$$

wherein r is the resistance of the resistor R; c is the capacitance of the capacitor C, l is the inductance of the inductor R.

For example, when the resistance r of the resistor R is known, then the real part (Re) of the matching impedance $Y_m$ can be obtained by equation (6), and the electrical length θ that the real part (Re) of the matching impedance $Y_m$ corresponds to in FIG. 4 can be used as the minimum electrical length d between the impedance matching circuit MC and the noise reflection circuit R-CMF.

In other words, when the resistor R of the impedance matching circuit MC is disposed in advance, the achievable minimum electrical length d between the impedance matching circuit MC and the noise reflection circuit R-CMF can be determined under the condition of the known resistance r of the resistor according to the electrical length θ that the real part (Re) of the matching impedance $Y_m$ corresponds to in FIG. 4.

Similarly, when the capacitor C and the inductor L are disposed in advance, the achievable minimum electrical length d between the impedance matching circuit MC and the noise reflection circuit R-CMF can be determined under the condition of the known capacitance c and inductance l according to the electrical length θ that the imaginary part (Im) of the matching impedance $Y_m$ corresponds to in FIG. 4.

For example, when the resistance r of the resistor R is already known, the real part (Re) of the matching impedance $Y_m$ can be determined based on equation (6), and the obtained real part (Re) of the matching impedance $Y_m$ is, for example, 0.7. Therefore, the electrical length θ obtained according to FIG. 4 can be at least 25 degrees.

Similarly, when the capacitance c and inductance l are already known, the imaginary part (Im) of the matching impedance $Y_m$ can be determined based on equation (7), and the obtained imaginary part (Im) of the matching impedance $Y_m$ is, for example, 2.54. Therefore, the electrical length θ obtained according to FIG. 4 can be at least 25 degrees.

Please continue referring to FIG. 4, in addition, when there is an expected length of the electrical length θ, the required resistance r, capacitance c and inductance l can be determined according to the real part (Re) and the imaginary part (Im) of the matching impedance $Y_m$ that the electrical length θ corresponds to in FIG. 4, under the condition that the electrical length θ is the expected length.

For example, when the expected electrical length θ is 100 degrees, the real part (Re) of the matching impedance $Y_m$ obtained according to FIG. 4 is 0.4, and the imaginary part (Im) is 2.07. That is, it is able to obtain the required resistance r, capacitance c and inductance l with the expected 100 degrees electrical length θ.

Accordingly, it is able to achieve absorbing noise at different frequency bands with the same resistance r.

Further, the relationship between the electrical length θ, which is the distance between the impedance matching circuit MC and the noise reflection circuit R-CMF, and the matching impedance $Y_m$ of the matching circuit MC can also be presented in a pre-established table. That is, after obtaining the relationship chart shown in FIG. 4, the real part (Re) and the imaginary part (Im) of the matching impedance $Y_m$ that each electrical length θ corresponds to can be presented as a table. Therefore, when designing the matching circuit MC, the parameters of the electrical length θ, resistance r, capacitance c and inductance l can be determined through the pre-established look-up table.

The matching circuit MC can be implemented by a layout of transmission lines in addition to being implemented by the RLC circuit.

In an embodiment of the present disclosure, the server that uses the series noise absorption circuit of the present disclosure can be used in Artificial Intelligence (AI) computing, edge computing, as well as in the 5G server, cloud server or server of the Internet of Vehicle.

In an embodiment of the present disclosure, the electronics used in vehicles that use the series noise absorption circuit of the present disclosure can be used in in-vehicle device, for example, self-driving vehicle, electric vehicle, or semi-self-driving vehicle.

In view of the above description, the series noise absorption circuit according to one or more embodiments of the present disclosure, comparing to the three-layer circuit boards of the prior art, the present disclosure can be realized with two-layer circuit boards, which not only reduces the manufacturing cost, but also reduces the size of the noise absorption circuit. Further, the series noise absorption circuit according to one or more embodiments of the present disclosure, it is able to increase the number of parameters for designing the noise absorption circuit, so as to reduce the dependence of the impedance matching circuit on the length of the differential signal transmission cable, thereby reducing the overall size of the noise absorption circuit.

The present disclosure has been disclosed above in the embodiments described above, however it is not intended to limit the present disclosure. It is within the scope of the present disclosure to be modified without deviating from the essence and scope of it. It is intended that the scope of the present disclosure is defined by the following claims and their equivalents.

What is claimed is:

1. A series noise absorption circuit, electrically connected to two signal feed lines, the series noise absorption circuit comprising:
   a differential signal transmission cable, electrically connected to the two signal feed lines, the differential signal transmission cable has a first transmission line and a second transmission line, the first transmission line and the second transmission line are configured to receive a differential pair of input signals from the two signal feed lines; and
   an impedance matching circuit, connected in series with the second transmission line, the impedance matching circuit is configured to receive a reflected signal from a noise reflection circuit, and match an input impedance corresponding to the series noise absorption circuit and a common mode characteristic impedance corresponding to the two signal feed lines,
   wherein a distance between the impedance matching circuit and the noise reflection circuit is a minimum electrical length, and the minimum electrical length is associated with a real part and an imaginary part of a matching impedance of the impedance matching circuit.

2. The series noise absorption circuit according to claim 1, wherein the minimum electrical length matches an impedance matching equation, and the impedance matching equation is that the common mode characteristic impedance is equal to the matching impedance of the impedance matching circuit.

3. The series noise absorption circuit according to claim 2, wherein the differential signal transmission cable, the impedance matching circuit and the noise reflection circuit are arranged as a T-type equivalent circuit, and the impedance matching equation comprising:

$$Z_{in}=Z_{0e};$$

$$Z_{in}=(Z_{11}-Z_{12})+[(Z_{22}-Z_{12}+Z_R)//Z_{12}]+1/Y_m; \text{ and}$$

$$1/Y_m=Z_{0e}-(Z_{11}-Z_{12})+[(Z_{22}-Z_{12}+Z_R)//Z_{12}],$$

wherein $Z_{11}=Z_{22}=-jZ_{0e}\cot(\theta \cdot f)$;

$Z_{12}=-jZ_{0e}\csc(\theta \cdot f)$, wherein $Z_{in}$ is the input impedance; $Z_{0e}$ is the common mode characteristic impedance; $Z_{11}$, $Z_{12}$ and $Z_{22}$ are parameters of an open-circuit impedance matrix of a two-port network; $Z_R$ is a reflection circuit impedance of the noise reflection circuit; $1/Y_m$ is a reciprocal of the matching impedance; $\theta$ is the minimum electrical length; and f is a propagation constant.

4. The series noise absorption circuit according to claim 1, wherein the impedance matching circuit includes a resistor, and a resistance of the resistor is associated with the real part of the matching impedance corresponding to the minimum electrical length.

5. The series noise absorption circuit according to claim 4, wherein the resistance of the resistor being associated with the real part of the matching impedance corresponding to the minimum electrical length is:

$$R=1/(2*Re\{Y_m\}),$$

wherein R is the resistance of the resistor, and $Y_m$ is the matching impedance.

6. The series noise absorption circuit according to claim 1, wherein the impedance matching circuit includes a capacitor and an inductor, and a capacitance of the capacitor and an inductance of the inductor are associated with the imaginary part of the matching impedance corresponding to the minimum electrical length.

7. The series noise absorption circuit according to claim 6, wherein the capacitance of the capacitor and the inductance of the inductor being associated with the imaginary part of the matching impedance corresponding to the minimum electrical length is:

$$Im\{Y_m\}=j\omega(0.5*C)+(1/j\omega 2*L),$$

wherein C is the capacitance of the capacitor, L is the inductance of the inductor, and $Y_m$ is the matching impedance.

8. The series noise absorption circuit according to claim 1 further comprising a ground layer, wherein the ground layer and the differential signal transmission cable are disposed to be spaced apart.

* * * * *